(12) United States Patent
Wang

(10) Patent No.: US 10,519,564 B2
(45) Date of Patent: Dec. 31, 2019

(54) TELESCOPING EXPANSION BELLOWS

(71) Applicant: Corner Star Limited, Kowloon (HK)

(72) Inventor: Jia Wang, Flemington, NJ (US)

(73) Assignee: Corner Star Llmited, Kowloon (HK)

( * ) Notice: Subject to any disclaimer, the term of this patent is extended or adjusted under 35 U.S.C. 154(b) by 197 days.

(21) Appl. No.: 15/719,000

(22) Filed: Sep. 28, 2017

(65) Prior Publication Data

US 2018/0087180 A1    Mar. 29, 2018

Related U.S. Application Data

(60) Provisional application No. 62/401,519, filed on Sep. 29, 2016.

(51) Int. Cl.
*C30B 15/00*   (2006.01)
*C30B 15/30*   (2006.01)
*C30B 29/06*   (2006.01)

(52) U.S. Cl.
CPC .............. *C30B 15/30* (2013.01); *C30B 29/06* (2013.01)

(58) Field of Classification Search
CPC ......... C30B 15/02; C30B 15/00; C30B 35/00; F16J 3/04
See application file for complete search history.

(56) References Cited

U.S. PATENT DOCUMENTS

| 3,679,370 A | 7/1972 | Czeck et al. |
| 4,410,494 A | 10/1983 | Fiegl |
| 6,485,007 B1 | 11/2002 | Duelli |

FOREIGN PATENT DOCUMENTS

| CN | 102560654 B | 7/2015 |
| EP | 0567008 A2 | 10/1993 |

OTHER PUBLICATIONS

International Search Report and Written Opinions from the International Searching Authority regarding PCT/US2017/054107 dated Nov. 28, 2017; pp. 1-13.

*Primary Examiner* — Robert M Kunemund
(74) *Attorney, Agent, or Firm* — Armstrong Teasdale LLP

(57) ABSTRACT

A bellows system includes a first bellows segment having a first end and a second end, the first bellows segment configured to elastically compress and expand. A first plate is coupled to the second end of the first bellows segment and a first sleeve is concentric with the first bellows segment, the first bellows segment disposed within the first sleeve. A second bellows segment has a third end and a fourth end. The second bellows segment is configured to elastically compress and expand, and the third end of the second bellows segment is coupled to the first plate. A second sleeve is coupled to the first plate. The second sleeve is concentric with the second bellows segment and the first sleeve, and the second bellows segment is disposed within the second sleeve. The second sleeve is configured to travel within the first sleeve.

15 Claims, 12 Drawing Sheets

TELESCOPING EXPANSION BELLOWS

CROSS REFERENCE TO RELATED APPLICATIONS

This application claims priority to U.S. provisional patent application Ser. No. 62/401,519, filed 29 Sep. 2016, which is hereby incorporated by reference in its entirety.

FIELD

This disclosure relates generally to semiconductor crystal growth using the continuous Czochralski method and more particularly to expansion bellows for use with a melt extraction vessel.

BACKGROUND

In the production of silicon crystals grown by the continuous Czochralski method, polycrystalline silicon is melted within a crucible of a crystal growing device to form a silicon melt. A seed crystal is then lowered to the melt and slowly raised back up, solidifying the melt onto the seed crystal. Multiple crystals can be grown using a single crystal growing device with additional polycrystalline material added during the process. However, impurities concentrate over time in the melt from metal impurities in the feed polycrystalline silicon, impurities in a crucible of the crystal growing device, and impurities from other components within the crystal growing device such as a carbon susceptor, heater, and/or other components. When impurities reach an unacceptable level, the continuous Czochralski process is stopped, as crystals grown from the melt include impurities which reduce the minority carrier lifetime of the crystal. Typically, to remove the contaminated melt, the crystal growing device is cooled. As a result of the cooling, the melt freezes and destroys the crucible containing the melt. The crucible is replaced and other components are cleaned, aligned, and assembled.

Alternatively, the contaminated melt can be extracted while in a liquid or semi-liquid state. Extraction of the melt allows for removal of the concentrated impurities and for continued use of crystal growing device without requiring replacement of run kit components, such as crucibles and other consumable components. Some known melt extraction devices use a vessel lowered into a melt housing assembly that contains the melt to be removed. The melt extraction device removes the melt using a vacuum. The melt travels up a vacuum tube and enters a cavity defined by a housing of the melt extraction device. The vacuum is provided using a bellows in connection with a vacuum port and the vessel. Known bellows do not satisfactory address buckling of the bellow.

Due to the nature of long travel distances, such as 58.75 inch or longer, the use of expansion bellows as a vacuum channel in a melt extraction application results in a bellows that can buckle easily, e.g., if the bellows itself is unguided. A buckled bellow can result in a leak in the vacuum channel and partial or complete loss of vacuum provided by the bellow. As a result, the extraction device operates at reduced efficiency or ceases to operate. With complete or partial loss of vacuum due to buckling of the bellow, the melt extraction device may not be capable of extracting the melt.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a bellow system includes several bellow segments with concentric sleeves guiding the movement of each bellow segment. Each bellow segment includes a certain length of the bellow with flanges welded on both ends of the bellow, and a guiding sleeve is welded on a top customized flange for each bellow segment. All of the components in the bellow segment such as bellow, guiding sleeve, and customized flanges are concentric each other, and each bellow segment shares the same customized flange in between. For example, the first bellow segment and the second bellow segment share the same intermediate customized flange, and the first bellow in the first bellow segment welded on the top surface of the flange and the second bellow of the second bellow segment is welded on the bottom surface of the intermediate customized flange. Each bellow segment is disposed within the guiding sleeve associated with its own bellow.

In another aspect, a bellows system includes a first bellows segment having a first end and a second end opposite the first end. The first bellows segment is configured to elastically compress and expand. The bellows system further includes a first plate coupled to the second end of the first bellows segment and a first sleeve concentric with the first bellows segment and the first plate, the first bellows segment and the first plate disposed within the first sleeve. The bellows system includes a second bellows segment having a third end and a fourth end opposite the third end. The second bellows segment is configured to elastically compress and expand, and the third end of the second bellows segment is coupled to the first plate. The bellows system further includes a second sleeve coupled to the first plate. The second sleeve is concentric with the second bellows segment and the first sleeve, and the second bellows segment is disposed within the second sleeve. The second sleeve is configured to travel within the first sleeve.

In another aspect, a melt extraction system for extracting a melt from a crucible includes a cylindrical housing having a top plate and a bottom plate opposite the top plate. The top plate and the bottom plate have are toroidal and define an opening. The melt extraction system further includes an extraction vessel disposed, within the cylindrical housing, configured to remove the melt from the crucible. The extraction vessel is coupled to a guide plate disposed within the cylindrical housing and between the top plate and the extraction vessel. The melt extraction system includes a bellows system coupled to the top plate and the guide plate. The bellows system includes several bellow segments with concentric sleeves guiding the movement of the bellow for each bellow segment. Each bellow segment includes a certain length of bellow with flanges welded on both ends of the bellow, and a guiding sleeve is welded on the top customized flange for each bellow segment. All of the components in the bellow segment such as bellow, guiding sleeve, and customized flanges are concentric, and each bellow segment shares the same intermediate customized flange in between. For example, the first bellow segment and the second bellow segment share the same intermediate customized flange, with the first bellow in the first bellow segment welded on the top surface of the flange and the second bellow of the second bellow segment is welded on the bottom surface of the flange. Each bellow segment is disposed within the guiding sleeve associated with its own bellow.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
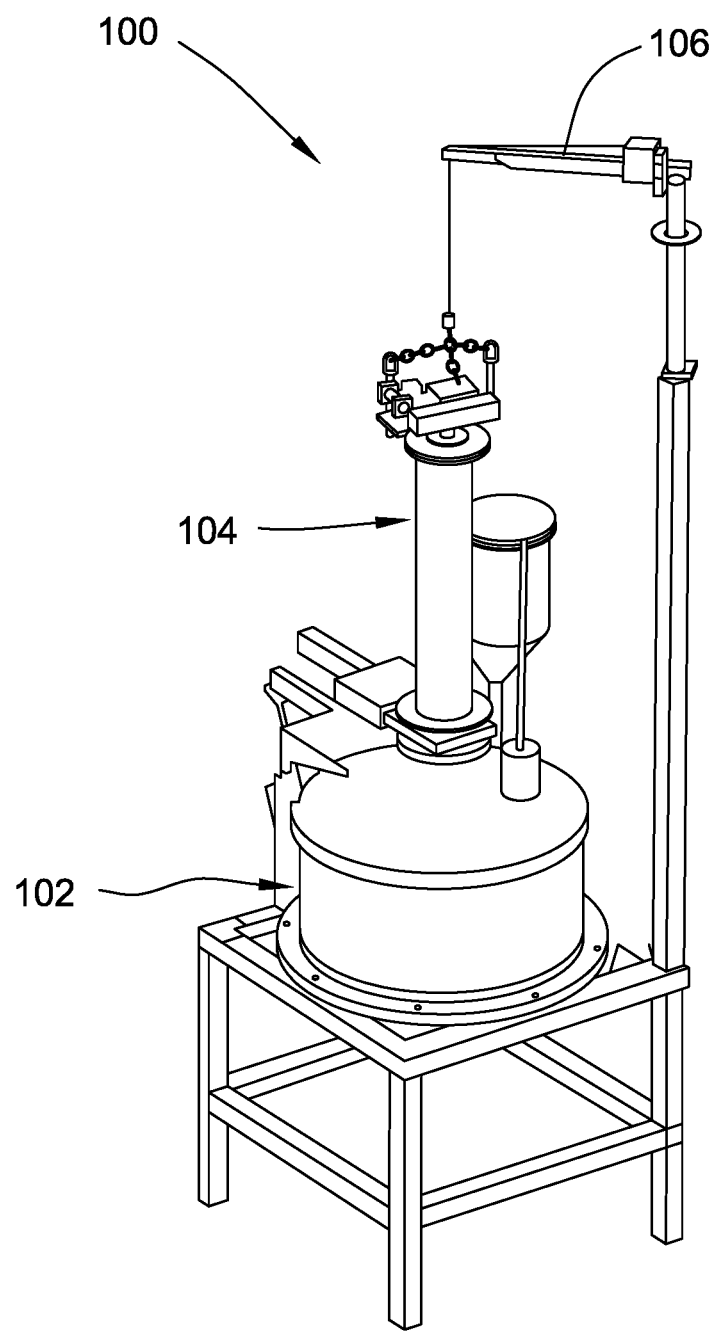
FIG. 1 is a perspective view of a crystal growing system.

Referring now to FIG. 1, a crystal growing system 100 includes a melt housing assembly 102, an extraction system 104, and a lift system 106. Crystal growing system 100 is configured to grow crystals of semiconductor or solar-grade material using a Czochralski method. Crystal growing system 100 produces ingots of semiconductor or solar-grade material. For example, crystal growing system 100 generates an ingot of silicon from polycrystalline silicon. The silicon may be doped with other elements.

In operation, crystal growing system 100 melts stock material in melt housing assembly 102 and pulls a crystal from melt housing assembly 102 using the Czochralski method. A plurality of crystals are grown sequentially with additional stock material being added to melt housing assembly 102. Over time, impurities concentrate in the melt. The melt is removed using extraction system 104 and lift system 106 to preserve melt housing assembly 102 and allow for continued generation of crystals using crystal growing system 100. As described in greater detail below, melt extraction system 104 includes an extraction vessel which is lowered into melt housing assembly 102 and extracts the melt using a vacuum supplied via a bellows system or vacuum line contained within the bellows system. After extracting the melt, the extraction vessel is raised into extraction system 104, and extraction system 104 is removed from melt housing assembly 102 using lift system 106.

Figure 2:
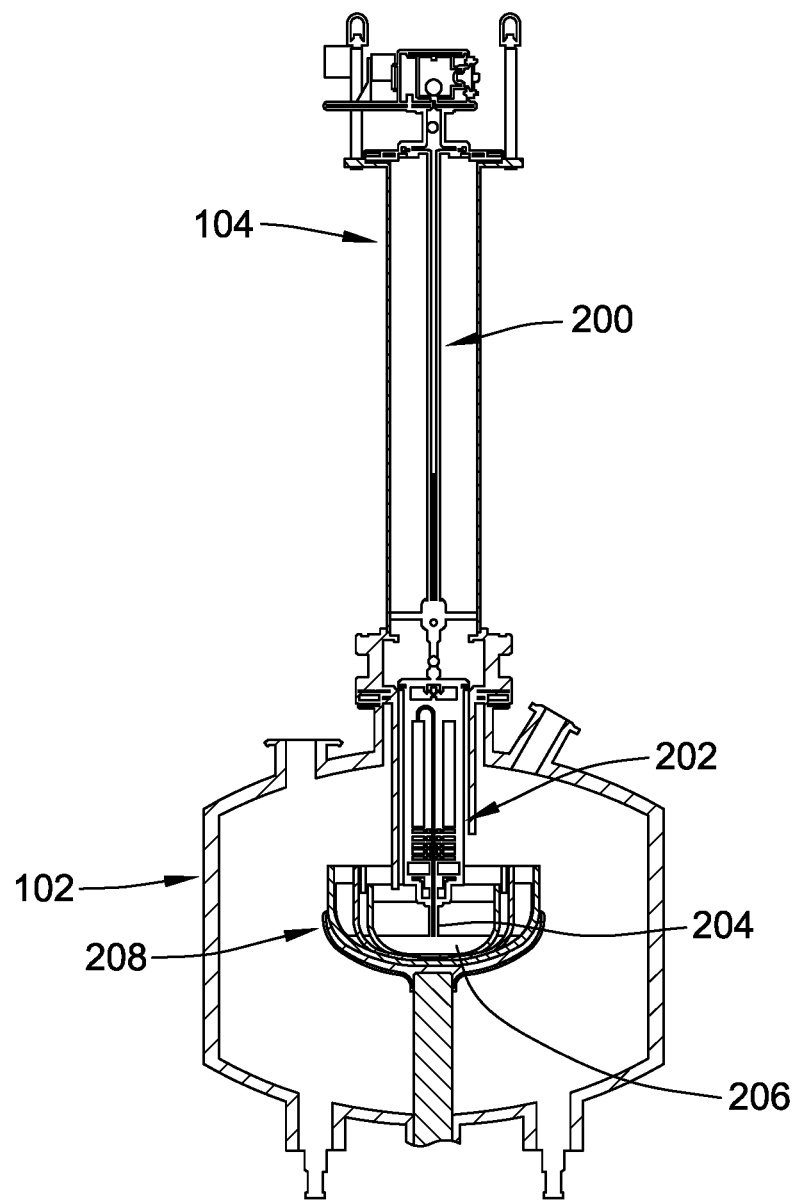
FIG. 2 is a cross section of a view of a portion of the crystal growing system shown in FIG. 1 including a melt housing assembly and an extraction system having a bellows system.
Figure 3:
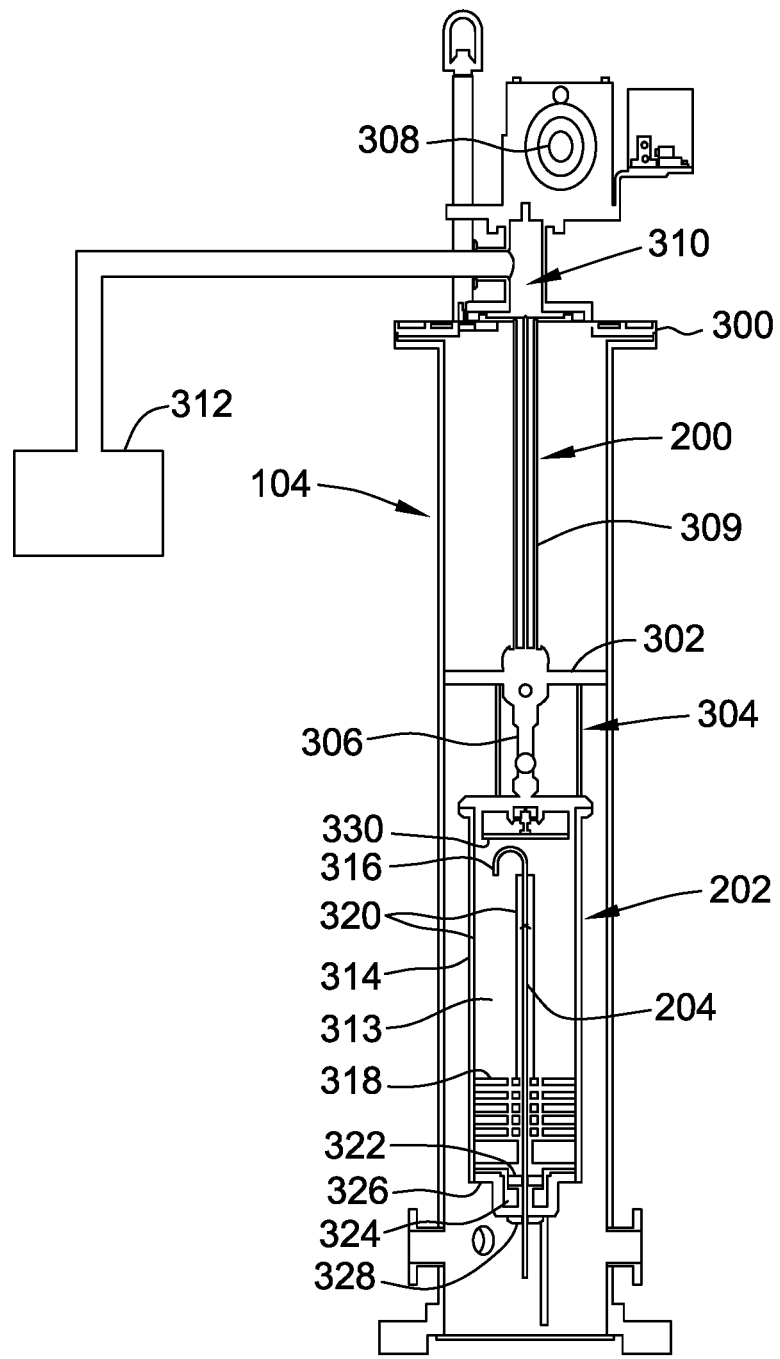
FIG. 3 is a more detailed cross section of a view of the extraction system and bellows system shown in FIG. 2.

Referring now to FIGS. 1-3, melt housing assembly 102 includes a crucible assembly 208 contained within a housing coupled to a bottom plate of extraction system 104. Crucible assembly 208 includes two concentric crucibles and a weir included in the innermost of the two concentric crucibles. Crucible assembly 208 contains melt 206 of polycrystalline silicon, dopants, and/or other semiconductor or solar-grade material. Crucible assembly 208 includes one or more heaters, susceptors, or other devices to supply thermal energy to melt 206 and/or crucible assembly 208.

With reference to FIG. 3, extraction system 104 includes bellows system 200, extraction vessel 202, extraction device 204, top plate 300 guiding plate 302, attaching rod 304, flexible hose 306, lifter 308, guiding rod 309, vacuum port 310, and vacuum source 312. Extraction system 104 is configured to extract melt 206 from melt housing assembly 102. Extraction vessel 202 is configured to contain at least a portion of melt 206 and withdraw the contained melt from crucible assembly 208. Extraction vessel 202 includes extraction device 204. Extraction device 204 is configured to draw melt 206 into extraction vessel 202 or otherwise transfer at least a portion of melt 206 from crucible assembly 208 to extraction vessel 202. For example, extraction device 204 is a vacuum driven tube.

In some embodiments, extraction device 204 is a single-walled quartz tube opening into a cavity 313 defined by a quartz container 314 disposed within extraction vessel 202. The tube includes a bend 316 of a particular angle, e.g., one hundred eighty degrees, ninety degrees, between zero and two hundred and seventy degrees, or another angle. Bend 316 reduces silicon accumulation within extraction device 204 and/or at the exit of extraction device 204 which may block extraction device 204. Extraction device 204 extends through an opening in the bottom of extraction vessel 202. At the opening in extraction vessel 202, extraction device 204 is disposed within at least one alumina donut ring 318 extending from extraction device 204 to the inner wall of extraction vessel 202. Above alumina donut ring 318, at least a portion of extraction device 204 is insulated with alumina insulation 320. Extraction vessel 202 is also insulated with alumina insulation 320. At the opening in extraction vessel 202, extraction device 204 is secured to extraction vessel 202 by a graphite packing ring 322, graphite rigid board 324 disposed within a graphite housing 326 through which extraction device 204 extends, and a graphite nut 328 exterior to extraction vessel 202 that secures extraction device 204 and/or the graphite housing to extraction vessel 202. In some embodiments, extraction vessel 202 includes an upper stop mechanism 330 above extraction device 204 and disposed within extraction vessel 202. Upper stop mechanism 330 is configured to secure extraction device 204 during extraction of melt material. For example, upper stop mechanism 330 receives extraction device 204.

Extraction vessel 202 is coupled to guiding plate 302 to allow for vertical movement of extraction vessel 202 as guiding plate 302 is raised or lowered. Guiding plate 302 is configured to travel within extraction system 104 along guiding rod 309 and prevent or reduce contact between extraction vessel 202 and an inner wall of extraction system 104 and also prevents rotation of extraction vessel 202 that can damage bellows system 200. Vacuum port 310, bellows system 200, and flexible hose 306 are configured to supply a vacuum to extraction vessel 202 and extraction device 204 for removing melt 206. In alternative embodiments, bellows system 200 includes a vacuum line (not shown) within bellows system 200. Lifter 308 is configured to raise and/or lower extraction vessel 202. Supplying a vacuum using bellows system 200 or a vacuum line contained within bellows system prevents or reduces contact between the vacuum supply mechanism and the interior wall of extraction system 104. For example, and without limitation, in comparison to a vacuum hose which may contact the interior wall of extraction system 104 as extraction vessel 202 is raised or lowered, bellows system 200 prevents or reduces contact with the interior wall of extraction system 104 while also supplying a vacuum to extraction vessel 202.

Extraction vessel 202 is coupled to a guiding plate 302 by one or more attaching rods, cables, and/or other fasteners. Guiding plate 302 is coupled to lifter 308 by a cable. The cable is within a cavity defined by bellows system 200. Lifter 308 is configured to raise and/or lower extraction vessel 202 using the cable. For example, lifter 308 raises and/or lowers guiding plate 302 by spooling or unspooling a cabled coupled to guiding plate 302. As guiding plate 302 moves, extraction vessel 202 coupled to guiding plate 302 also moves. Bellows system 200 expands and/or contracts as lifter 308 raises and/or lowers guiding plate 302. Bellows system 200 is coupled to guiding plate 302 and top plate 300 and expands and contracts with the movement of guiding plate 302 within extraction system 104.

Guiding plate 302 is configured to travel along guiding rod 309. Guiding rod 309 prevents guiding plate from contacting the interior surface of extraction system 104. Guiding rod 309 is coupled to extraction system 104. For example, guiding rod 309 is bolted to a set of plates that are in turn bolted to the top and bottom surface of extraction system 104 respectively. In one embodiment, guiding rod 309 extends through a hole of a mounting plate that is bolted to a bottom plate opposite top plate 300. Guiding plate 302 includes an opening through which guiding rod 309 extends vertically.

Extraction vessel 202 is coupled to guiding plate 302 by flexible hose 306. For example, flexible hose 306 is coupled to a first fitting on extraction vessel 202 that opens into the interior of extraction vessel 202 such that flexible hose 306 is in fluid communication with a cavity defined by extraction vessel 202. Flexible hose 306 is further coupled to a second fitting on guiding plate 302. Guiding plate 302 is coupled to bellows system 200. For example, bellows system 200 is bolted to guiding plate 302 with an O-ring to form a vacuum seal, secured to guiding plate 302 by a threaded connection, or otherwise coupled to guiding plate 302 using a fastener such as nuts and bolts, rivets, screws, adhesives, or other fasteners. Bellows system 200 is in fluid communication with flexible hose 306 through the second fitting on guiding plate 302 and an internal passageway or other cavity extending through guiding plate 302, from the second fitting to which flexible hose 306 is coupled and to bellows system 200. In alternative embodiments, bellows system 200 contains a vacuum hose (not shown) to which flexible hose 306 is coupled.

Bellows system 200 is coupled to top plate 300 of extraction system 104. For example, bellows system 200 is welded to top plate 300, secured to top plate 300 by a threaded connection, or otherwise coupled to top plate 300 using a fastener such as nuts and bolts, rivets, screws, adhesives, or other fasteners. Top plate 300 includes a cavity which allows for fluid communication between bellows system and vacuum port 310. Vacuum port 310 is coupled to top plate 300. For example, vacuum port 310 is welded or bolted to top plate 300, secured to top plate 300 by a threaded connection, or otherwise coupled to top plate 300 using a fastener such as nuts and bolts, rivets, screws, adhesives, or other fasteners.

Vacuum port 310 is configured to provide a vacuum to extraction vessel 202 through top plate 300, bellows system 200, guiding plate 302, and flexible hose 306. Vacuum port 310 is supplied with a vacuum through a connection to a vacuum source 312 such as a vacuum pump.

Vacuum port 310 is further coupled to lifter 308. Lifter 308 is configured to raise and lower extraction vessel 202. Vacuum port 310 is welded or bolted to lifter 308, secured to lifter 308 by a threaded connection, or otherwise coupled to lifter 308 using a fastener such as nuts and bolts, rivets, screws, or other fasteners. Vacuum port 310 defines a cavity through which a cable (shown in FIG. 8) of lifter 308 passes. The cable extends through a cavity defined by bellows system 200. The cable is coupled to guiding plate 302. Lifter 308 winds or unwinds the cable, for example using an electric motor, to raise and lower guiding plate 302. Raising and lowering guiding plate 302 causes extraction vessel 202 to raise and lower and bellows system 200 to contract or expand.

FIGS. 4-7 are several views of an example of bellows system 200. Bellows system 200 includes guide rods to prevent or reduce buckling of bellows system 200.

Figure 4:
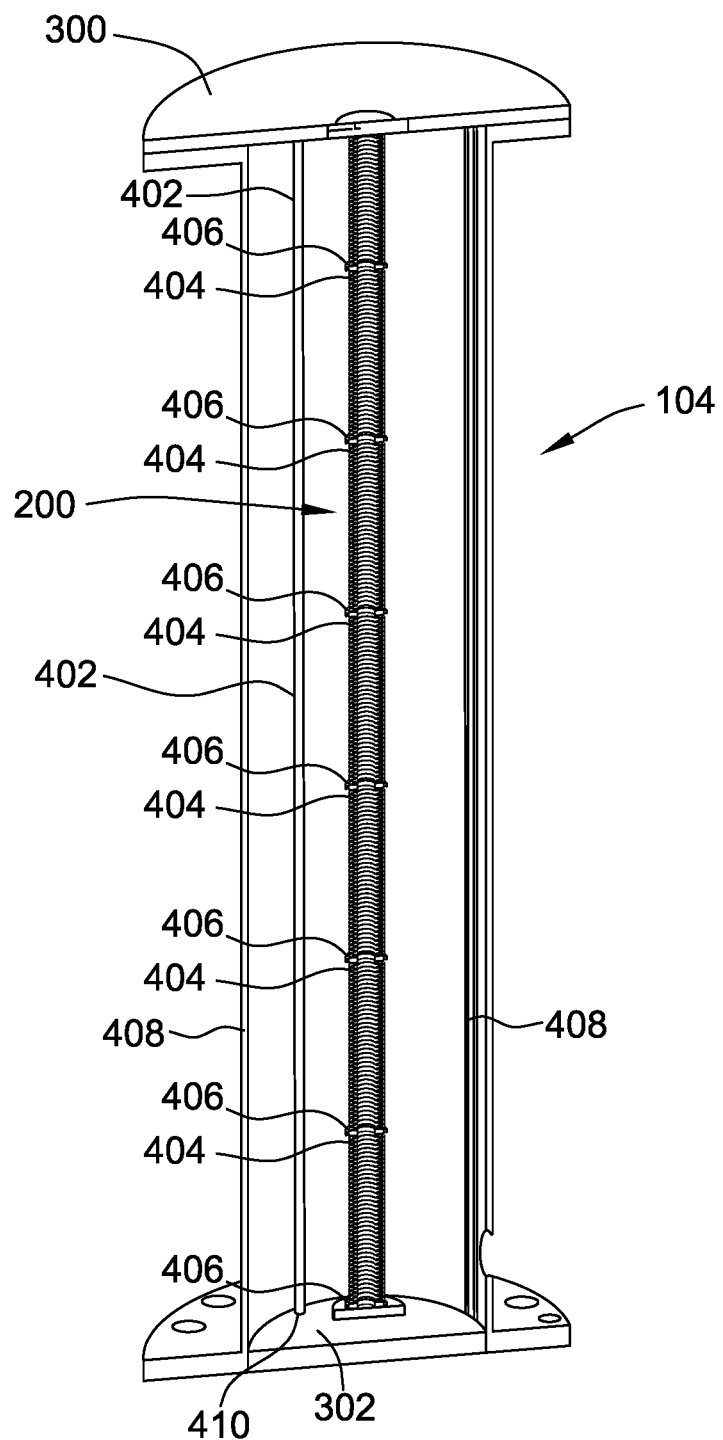
FIG. 4 is a perspective view of one embodiment of the bellows system shown in FIG. 3.
Figure 5:
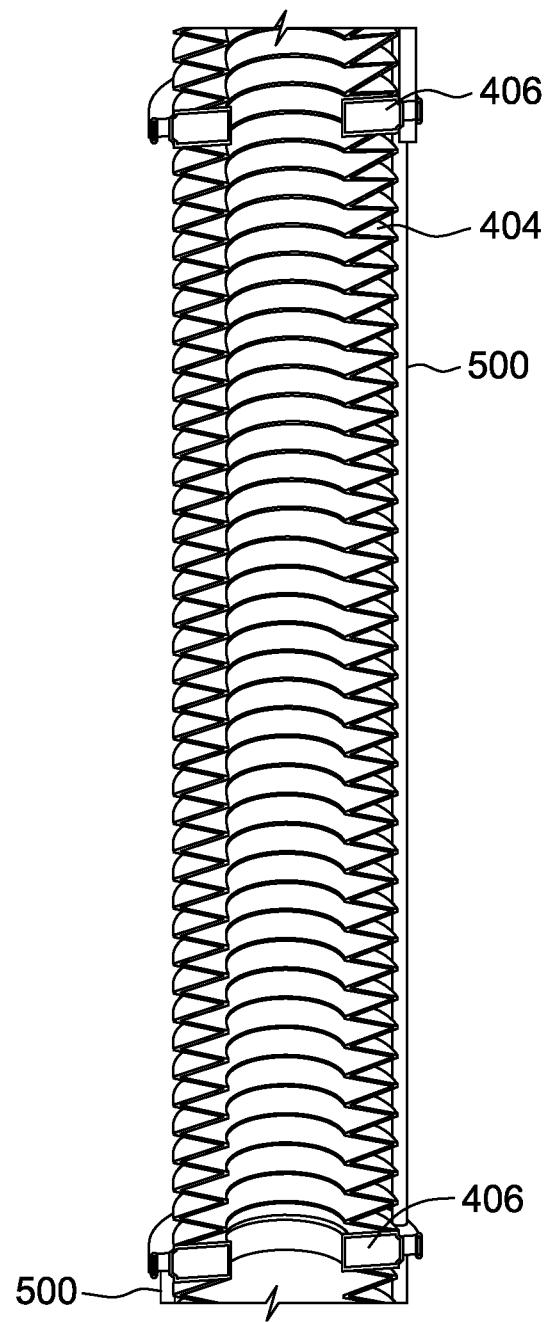
FIG. 5 is a perspective, cross section of a view of a bellow segment of the bellows system shown in FIG. 4.

Referring now to FIG. 4, bellows system 200 includes a plurality of bellow segments 404, a plurality of intermediate plates 406, and a plurality of intermediate guide rods (shown in FIG. 5). Bellows system 200 is configured to expand and compress as guiding plate 302, to which bellows system 200 is coupled, moves within extraction system 104. Guiding plate 302 is guided by master guide rod 402. Bellow segments 404, intermediate plates 406, and the intermediate guide rods are configured to prevent or reduce buckling of bellows system 200.

Master guide rod 402 is configured to guide bellows system by interacting with guiding plate 302. Master guide rod 402 is coupled to top plate 300 and extends through opening 410 of guiding plate 302. Master guide rod 402 prevents guiding plate 302 and/or bellows system 200 from contacting the internal vertical walls 408 of extraction system 104 through interference between master guide rod 402 and opening 410 in guiding plate 302 through which master guide rod 402 extends. For example, a diameter of opening 410 and a diameter of master guide rod 402 are sized to provide a running fit between opening 410 and master guide rod 402. This allows for guiding plate 302 to travel along master guide rod 402, but prevents substantial lateral movement of guiding plate 302 as guiding plate 302 contacts master guide rod 402. Master guide rod 402 also prevents rotation of guiding plate 302 within extraction system 104 and prevents rotation of bellows system 200. This prevents damage to bellows system 200.

Bellows system 200 includes a plurality of bellow segments 404 and a plurality of intermediate customized flange (plates) 406. Bellow segments 404 and intermediate customized flange (plates) 406, along with intermediate guide rods (shown in FIG. 5), prevent or reduce buckling of bellows system 200. As used herein the term "intermediate customized flange (plates)" should be understood to include flanges (plates) positioned between two bellow segments 404 (e.g., intermediate customized flanges (plates) 406). As used herein the term "flanges (plates)" should be understood to include plates positioned between two bellow segments 404 or coupled to only one bellow segment 404 (e.g., intermediate flanges (plates) 406, top plate 300, and/or guiding plate 302). Bellow segments 404 are coupled to one another by intermediate plates 406. Bellow segments 404 are coupled to intermediate plates 406. For example, bellow segment 404 is welded to intermediate plate 406, secured to intermediate plate 406 by a threaded connection, or otherwise coupled to intermediate plate 406 using a fastener such as nuts and bolts, rivets, screws, or other fasteners. The first bellow segment 404 is coupled to top plate 300, and the last bellow segment 404 is coupled to guiding plate 302, using one or more of the techniques or components as described above.

Referring now to FIG. 5, bellows system 200, illustrated with bellow segments 404 extended, includes a plurality of intermediate guide rods 500. Intermediate guide rods 500 extend through at least two intermediate plates 406. Intermediate guide rods 500 prevent or reduce buckling of bellow segments 404 and/or bellows system 200 as a whole. Intermediate guide rods 500 substantially prevent intermediate plates 406 from deviating from a central vertical axis along which bellows system 200 expands and contracts vertically. Intermediate guide rods 500 prevent or reduce lateral movement of intermediate plates 406 through interference between intermediate guide rods 500 and the openings in intermediate plates 406 through which intermediate guide rods 500 extend.

Figure 6:
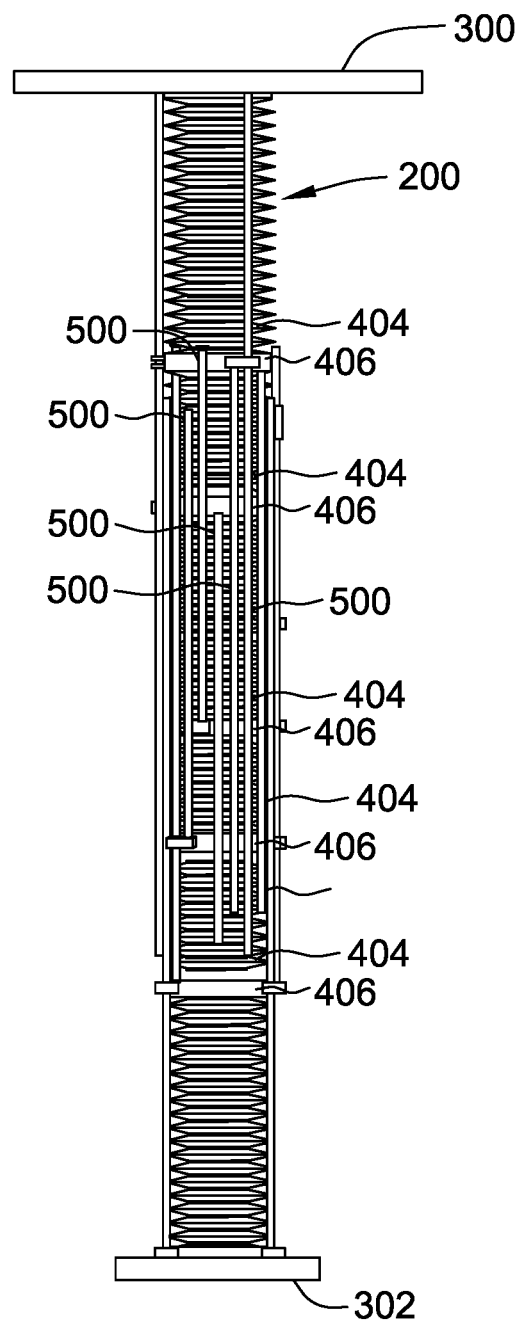
FIG. 6 is an elevation view of another embodiment of the bellows system shown in FIG. 3.
Figure 7:
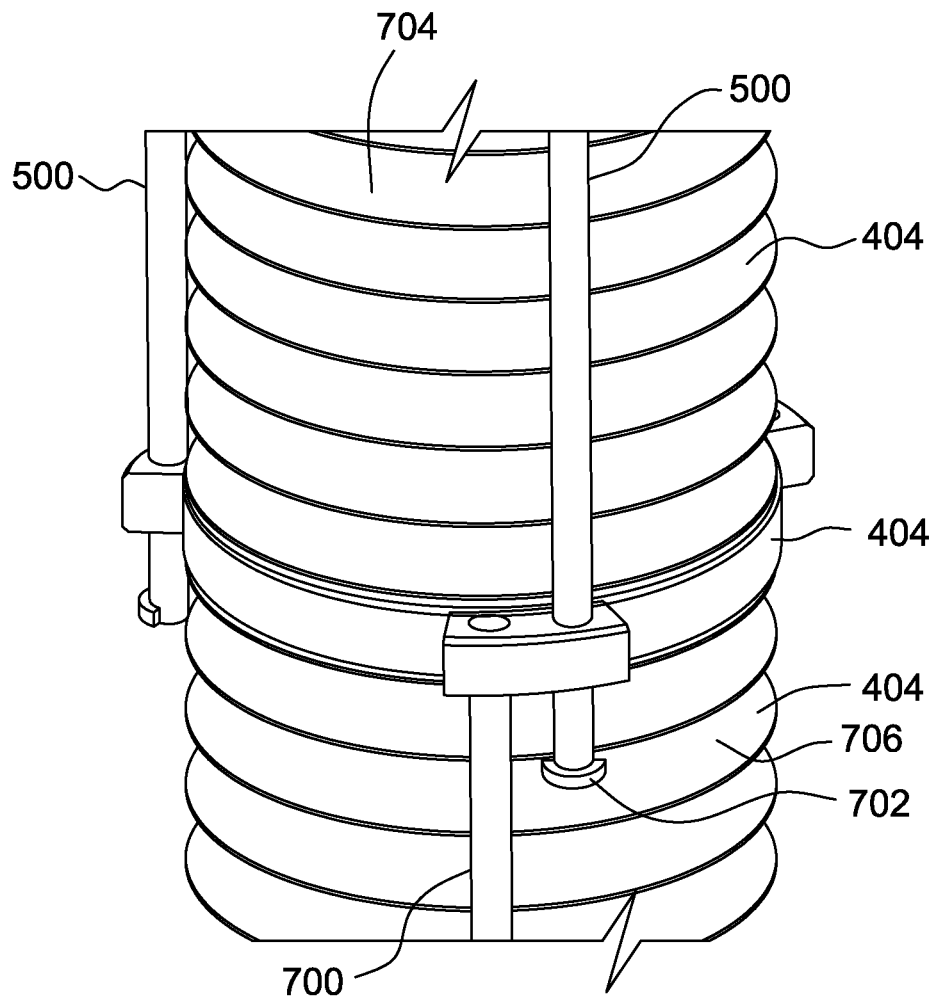
FIG. 7 is detail view of the bellows system shown in FIG. 6.

Referring now to FIG. 6, bellows system 200 is illustrated with bellow segments 404 in compression. In FIG. 7, bellows system 200 includes seven bellow segments 404 and six intermediate flanges (plates) 406 of the type shown in FIG. 5. Each bellow segment 404 is guided by three intermediate guide rods 500 passing through the intermediate flange (plate) 406 to which the bellow segment 404 is coupled, e.g., welded. The three intermediate guide rods 500 are each separated by 120 degrees. Each guide rod 500 is further separated by 15 degrees from intermediate guide rods 500 associated with bellow segments 404 above and/or below. For example, a first 704 bellow segment 404 is attached to top flange (plate) 300 and a first intermediate flange (plate) 406. The associated intermediate guide rods 500 are positioned at 0 degrees, 120 degrees, and 240 degrees. A second 706 bellow segment 404 is attached to the first intermediate flange (plate) 406 to which first 704 bellow segment 404 is attached and a second intermediate flange (plate) 406. The intermediate guide rods 500 associated with second 706 bellow segment 404 are positioned at 15 degrees, 135 degrees, and 255 degrees. Each intermediate guide rod 500 extends through at most two intermediate flanges (plates) 406, and one side of guide rod 500 is bolted together with one intermediate flange (plate) 406. The other side of guide rod 500 slides through intermediate flange (plate) 406.

Each intermediate guide rod 500 is welded or otherwise attached at one end to top plate 300, intermediate plate 406, or bottom bellows flange (guiding plate) 302. The other end of each intermediate guide rod 500 is free and includes a stop 702 which prevents intermediate guide rod 500 from pulling through intermediate plate 406. For example, a first intermediate guide rod 500 is welded or otherwise attached to top plate 300 and passes through an opening in intermediate plate 406. The first intermediate guide rod 500 includes stop 702 which prevents first intermediate guide rod 500 from pulling through intermediate plate 406. A second intermediate guide rod 700 is bolted or welded to intermediate flange (plate) 406 and extends through a second intermediate plate 406.

Each bellow segment 404 is corrugated or otherwise shaped to facilitate elastic deformation of bellow segment 404. Bellow segments 404 are made of one or more metals or metal alloys. For example, bellow segments 404 may be made of stainless steel or an alloy of stainless steel such as Society of Automotive Engineers (SAE) steel grade 321. Bellow segments 404 have an inner diameter of 0.975 inches and an outer diameter of 1.875 inches. Bellows system 200 including bellows segments 404 has a stiffness of 0.16 pounds per inch. Bellows system 200 including bellows segments 404 has a length, along the axis of compression, of 19.5 inches at maximum compression and a length of 78.25 inches at maximum extension. Each of the seven bellow segments 404, section one coupled to top plate 300 and section seven coupled to guiding plate 302, and the corresponding intermediate guide rods 500 have the characteristics delineated in Table 1 below.

TABLE 1

Configuration of bellows system 200.

| Section Number | Free Length (Inch) | Compressed Length (Inch) | Extended Length (Inch) | Rod Length (Inch) | Rod Attachment Location |
|---|---|---|---|---|---|
| 1 | 16 | 4.41 | 17.44 | 15.5 | Top Flange (Plate) |
| 2 | 8.22 | 2.27 | 8.96 | 9.75 | Upper Intermediate Flange (Plate) |
| 3 | 6.39 | 1.76 | 6.97 | 7.75 | Upper Intermediate Flange (Plate) |
| 4 | 5.49 | 1.51 | 5.98 | 6.75 | Lower Intermediate Flange (Plate) |
| 5 | 6.39 | 1.76 | 6.97 | 7.75 | Lower Intermediate Flange (Plate) |
| 6 | 8.22 | 8.96 | 8.96 | 9.75 | Lower Intermediate Flange (Plate) |
| 7 | 16 | 4.41 | 17.44 | 15.5 | Bottom Flange (Guiding Plate) |
| Overall | 18.4 | 18.4 | 72.7 | | |

In alternative embodiments, bellows system 200, including bellow segments 404, are made of other materials, have a different geometry, a different number or size of bellows segments 404, a different number or size of intermediate guide rods 500 corresponding to each bellow segment 404, or otherwise differs from bellows system 200 as illustrated. For example, bellows system 200 is constructed of different metals or metal alloys, plastics, ceramic coated materials, and/or other materials. Bellows system 200 may have bellow segments 404 having a variety of inner and outer diameters. Bellows system 200 may have fewer than seven or more than seven bellow segments 404. Bellows system 200 may have fewer or more than three intermediate guide rods 500 corresponding to each bellow segment 404. Intermediate guide rods 500 corresponding to a single bellow segment 404 may be separated by more or less than 120 degrees. Intermediate guide rods 500 may be separated by more or less than 15 degrees relative to intermediate guide rods associated with other bellow segments 404. The length of each bellow segment 404 and intermediate guide rod 500, as well as the welding or attachment location of each intermediate guide rod 500 may differ from Table 1. In some embodiments, bellows system 200 has an expanded length of 55 inches. In some embodiments, a bellows system 200 with 55 inches of travel allows for extraction vessel 202 to be lowered from extraction system 104 into melt housing assembly 102 to extract melt 206 and be raised into extraction system 104.

Figure 8:
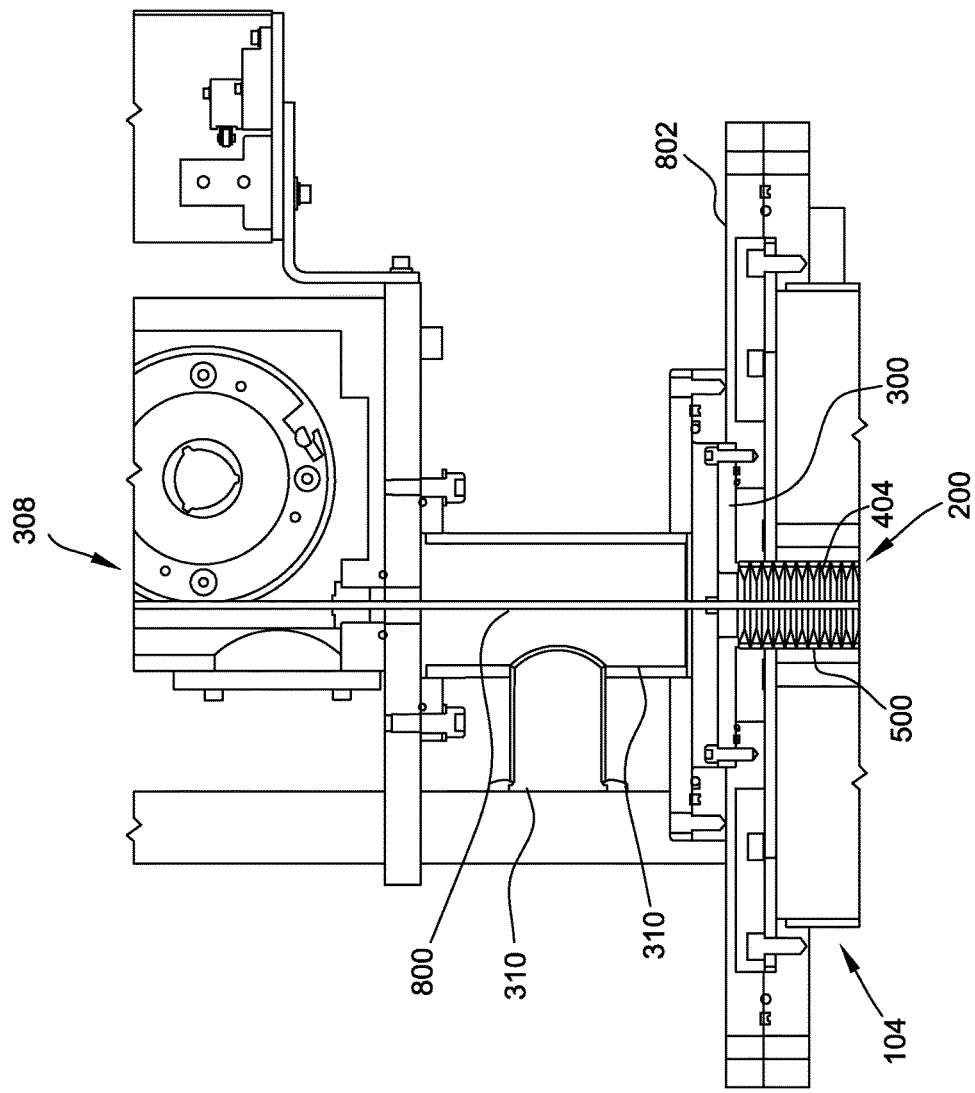
FIG. 8 is a cross section of a view of the bellows system shown in FIG. 3 coupled to a vacuum port.
Figure 9:
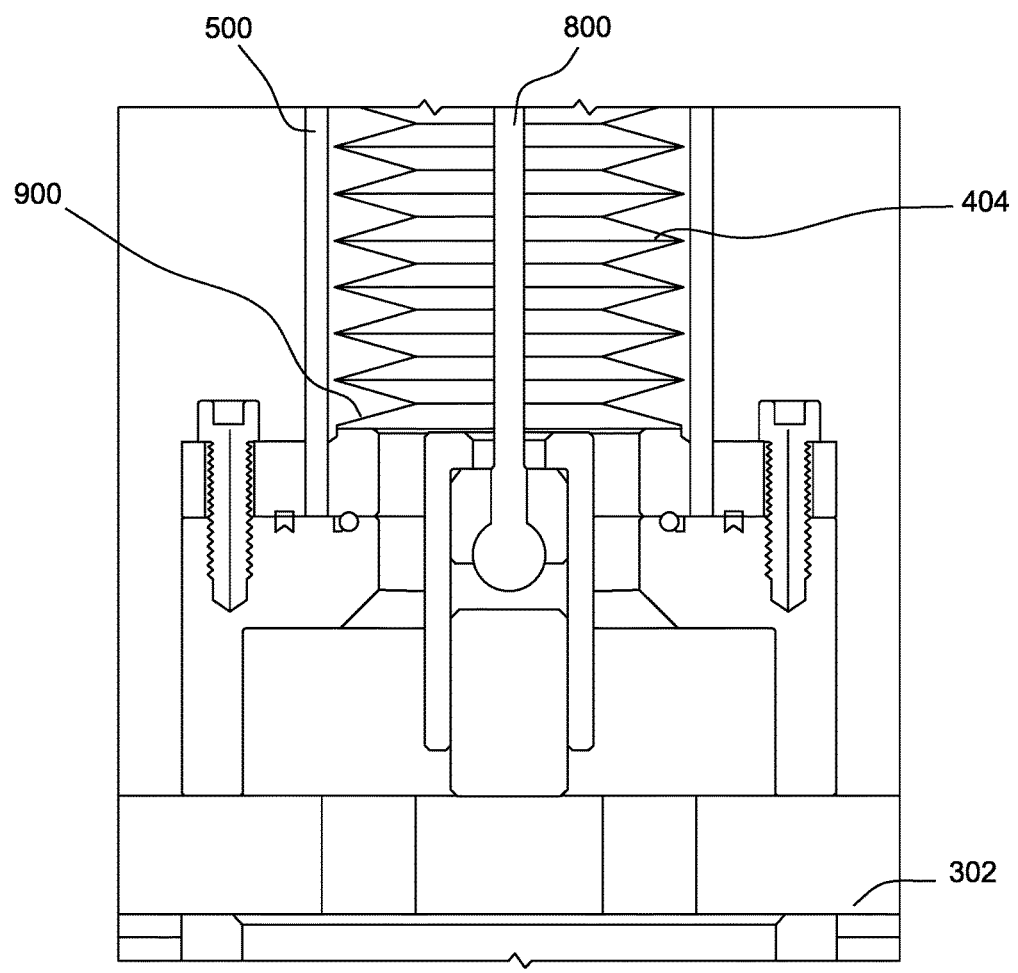
FIG. 9 is a cross section of a view of the bellows system shown in FIG. 3 coupled to a guiding plate.

Referring now to FIGS. 8 and 9, bellows system 200 is coupled to top bellow mounting plate 802 of extraction system 104. Top plate 300 is coupled to top bellow mounting plate 802 by an o ring or other gasket and two or more bolts. Vacuum port 310 is coupled to top bellow mounting plate 802 and defines a cavity which aligns with a cavity defined by bellow segments 404. A cable 800 is coupled to lifter 308 and passes through the cavity defined by vacuum port 310 and the cavity defined by bellow segments 404. Cable 800 is coupled to bottom bellow mounting plate 900. Bottom bellow mounting plate 900 is further coupled to guiding plate 302. For example, Bottom bellow mounting plate 900 is attached to guiding plate 302 by two or more bolts and an o-ring. Bellow segment 404 is coupled, e.g., welded, to bottom bellow mounting plate 900. Bottom bellow mounting plate 900 and guiding plate 302 include a cavity which supplies a vacuum from vacuum port 310 to flexible hose 306 (not shown in FIGS. 8 and 9) coupled to guiding plate 302.

Intermediate guide rods 500 are coupled to top plate 300 and bottom bellow mounting plate 900. As lifter 308 winds or unwinds cable 800, guiding plate 302 is raised or lowered within extraction system 104. As guiding plate raises or lowers, bellows system 200, e.g., intermediate bellows 404, compress or expand. Intermediate guide rods 500 move with corresponding intermediate plates 406 or bottom bellow mounting plate 802 to which they are coupled. Intermediate plates 406 slide along intermediate guide rods 500 and prevent or reduce lateral movement of intermediate plates 406 and bellow segments 404. This prevents buckling of bellows system 200 and prevents bellow segments 404 and/or other components of bellows system 200 from contacting the inner wall of extraction system 104.

Figure 10:
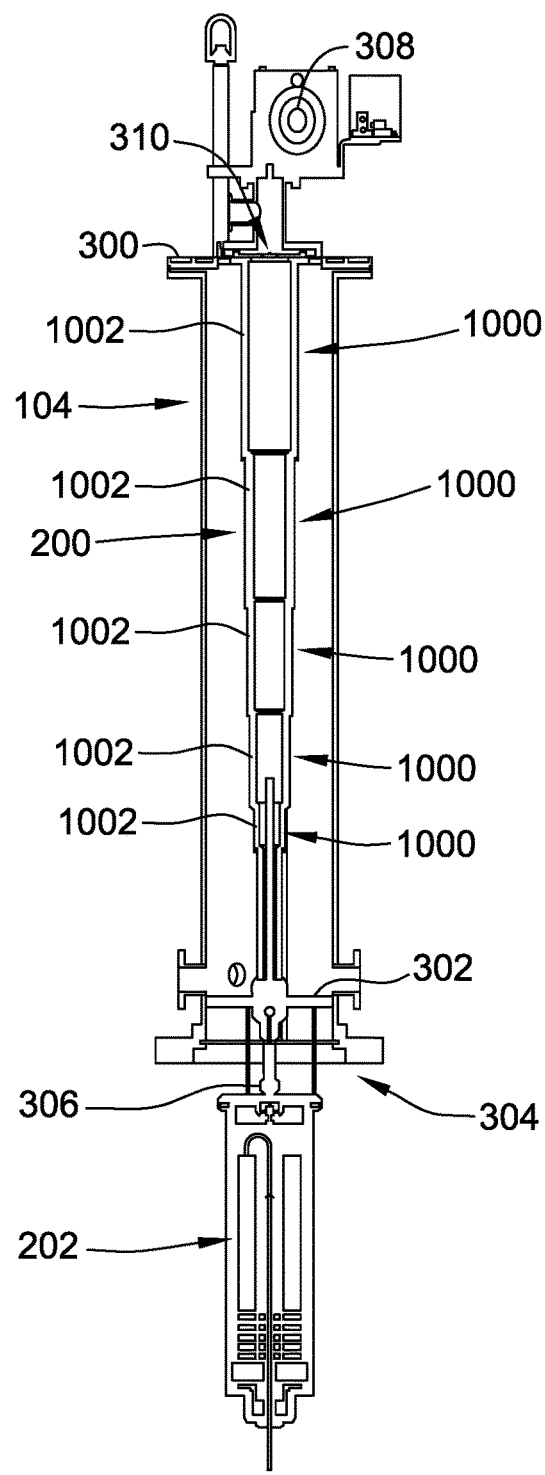
FIG. 10 is a cross section of a view of the extraction system shown in FIG. 2 an alternative embodiment of the bellows system.
Figure 11:
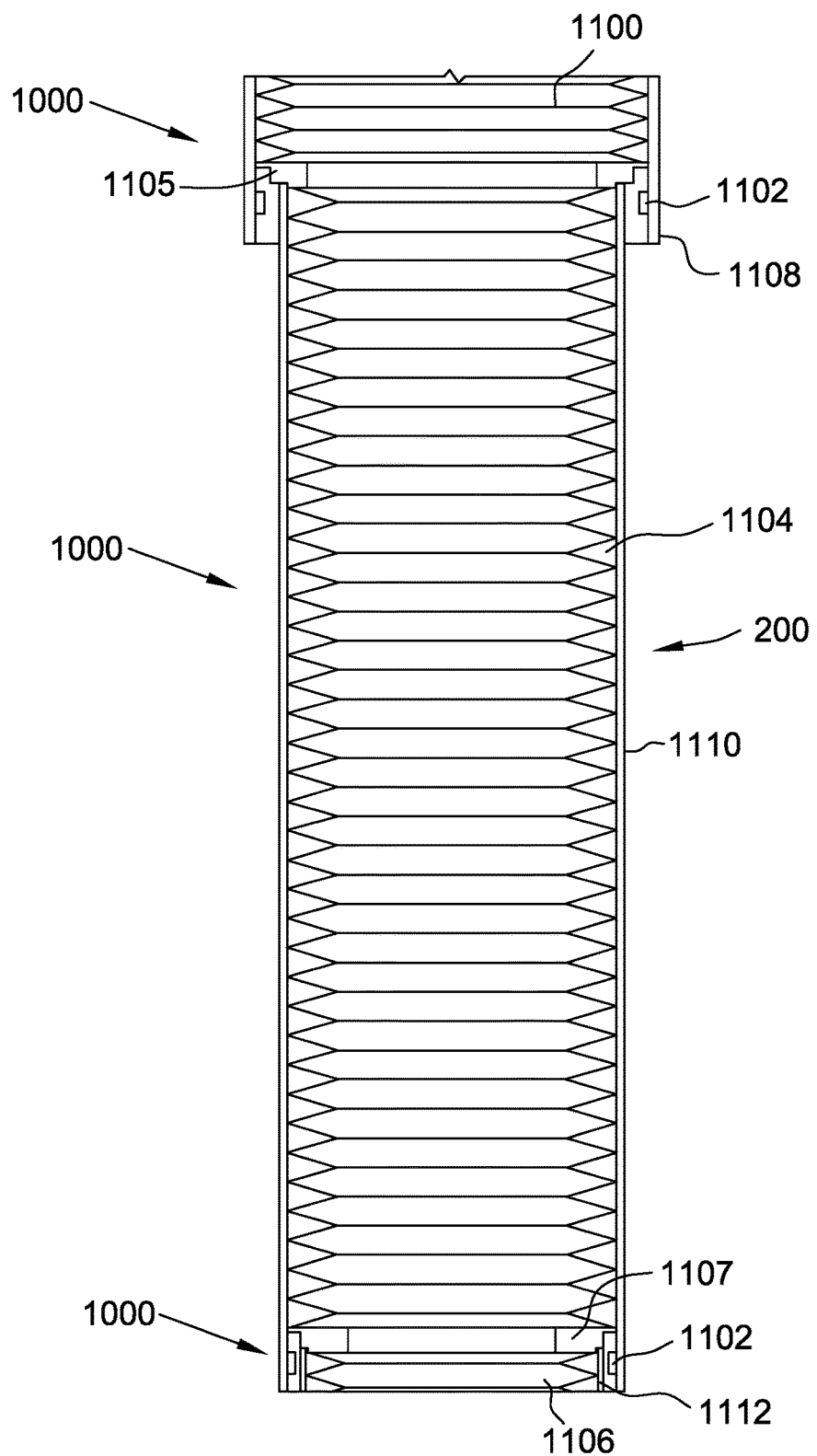
FIG. 11 is a detailed view of a portion of the bellows system shown in FIG. 10.
Figure 12:
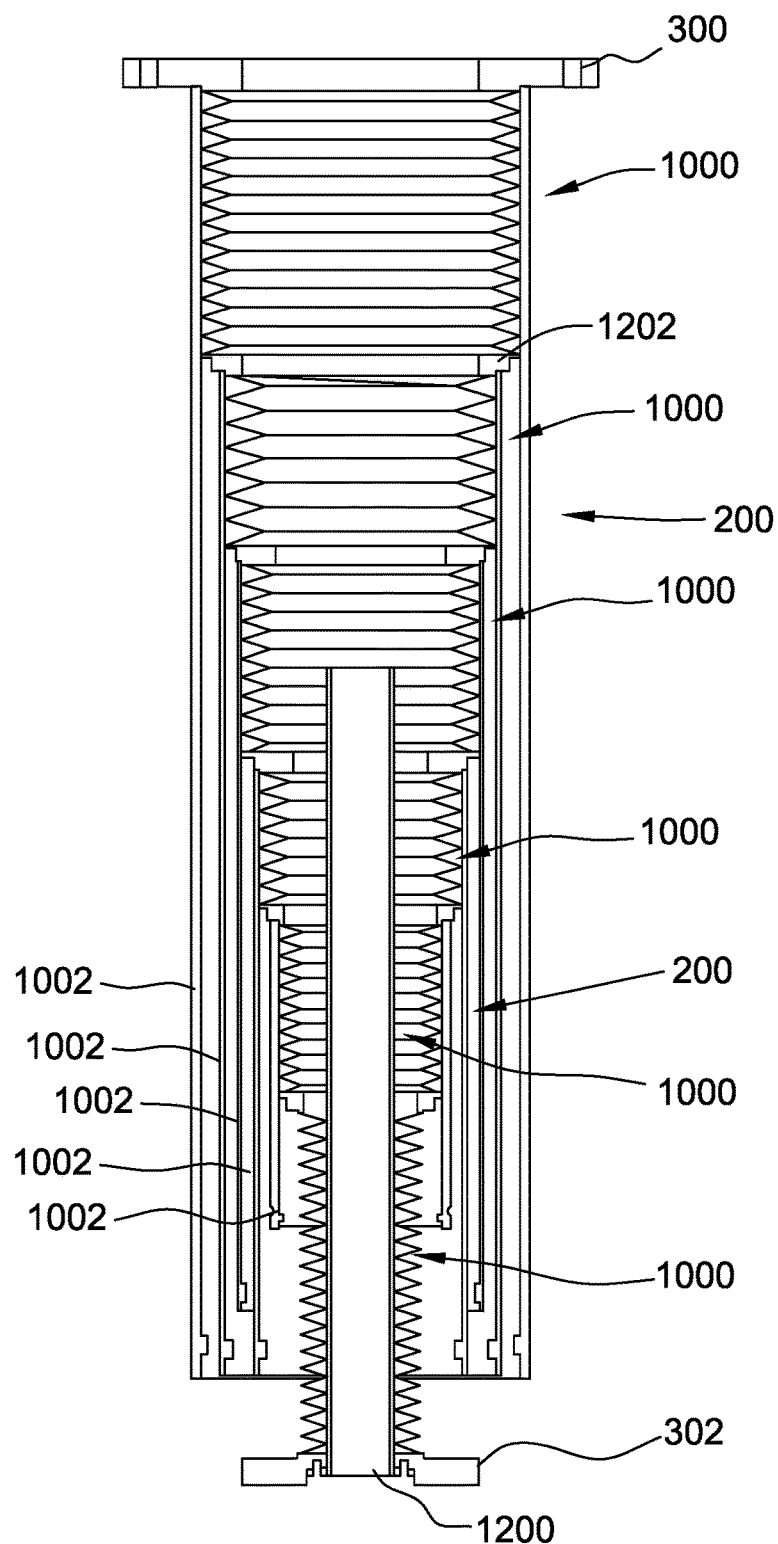
FIG. 12 is a detailed view of the bellows system shown in FIG. 10.

FIGS. 10-12 are several views of an example of bellows system 200. Bellows system 200 includes telescoping bellow segments 1000 and sleeves 1002 to prevent or reduce buckling of bellows system 200.

Referring now to FIG. 10, bellows system 200, illustrated in extension, includes a plurality of telescoping bellow segments 1000 in an alternative embodiment. Bellows system 200 is configured to prevent buckling of bellows system 200 by containing telescoping bellow segments within sleeves 1002. This is in contrast to other embodiments of bellows system 200 which include intermediate guide rods 500. In this embodiment, bellows system 200 does not include guide rods, but rather, sleeves 1002 and telescoping bellow segments 1000 prevent or reduce buckling of bellows system 200. As bellows system 200 compresses, telescoping bellow segments 1000 compress and telescope into sleeves 1002 associated with other telescoping bellow segments 1000.

Telescoping bellow segments 1000 are disposed within sleeves 1002. Bellows system 200, including telescoping bellows segments 1000, is coupled to top plate 300 and guiding plate 302 and is positioned within extraction system 104. Bellows system 200 defines a cavity through which cable 800 (not shown), attached to lifter 308, passes. Cable 800 is attached to guiding plate 302. The cavity defined by bellows system 200 further provides a vacuum to extraction vessel 202 from vacuum port 310 and via guiding plate 302 and flexible hose 306. Telescoping bellows segments 1000 expand and compress as lifter 308 lowers and raises guiding plate 302. Telescoping bellows segments 1000 further telescope within each other and out of each other as lifter 308 raises and lowers guiding plate 302. As guiding plate 302 is raised and lowered, extraction vessel 202 is raised and lowered due to the connection between extraction vessel 202 and guiding plate 302 by attaching rod 304.

Sleeves 1002 are configured to contain telescoping bellows segments 1000. Sleeves 1002 may prevent or reduce buckling of telescoping bellows segments 1000 due to interference preventing lateral movement of telescoping bellows segments 1000. The telescoping nature of bellows system 200 allows for the advantages of a sleeved bellow while reducing the overall height of bellows system 200 as sleeves 1002 can slide into the above sleeve 1002 as bellows system 200 is compressed.

Referring now to FIG. 11, bellows system 200, illustrated in extension, includes a plurality of telescoping bellow segments 1000 which compress and extend within each other. First segment 1100 is coupled to top plate 300 (not shown). For example, first segment 1100 is welded to top plate 300, secured to top plate 300 by a threaded connection, or otherwise coupled to top plate 300 using a fastener such as nuts and bolts, rivets, screws, adhesives, or other fasteners. First segment 1100 is disposed within first sleeve 1108. First sleeve 1108 is coupled, e.g., welded, to top plate 300. First sleeve 1108 has an inner diameter larger than the outer diameter of first segment 1100. For example, first sleeve 1108 is sized relative to first segment 1100 to provide a sliding fit, running fit, or other fit which allows first segment 1100 to move, e.g., expand or compress, within first sleeve 1108. This allows containment of first segment 1100, which may prevent or reduce buckling, while allowing first segment 1100 to compress and expand within first sleeve 1108.

First segment 1100 is further coupled, e.g., welded, to second intermediate plate 1105. Second intermediate plate 1105 is the second plate in bellows system 200 and is disposed below top plate 300. Second intermediate plate 1105 has an outer diameter less than the inner diameter of first sleeve 1108 and is disposed within first sleeve 1108. Second intermediate plate 1105 has an inner diameter which defines a cavity through which cable 800 (not shown) passes and through which a vacuum is provided from vacuum port 310 (not shown) to flexible hose 306 (not shown). First sleeve 1108 includes a stop 1102 which reduces the inner diameter of first sleeve 1108, at that point, to a diameter less than the outer diameter of second intermediate plate 1105. Stop 1102 prevents second intermediate plate 1105 from pulling out of first sleeve 1108 when bellows system 200 is in extension.

A second sleeve 1110 is coupled, e.g., welded, to second intermediate plate 1105. Second sleeve 1110 has an outer diameter less than the inner diameter of first sleeve 1108 and stop 1102 of first sleeve 1108. This allows second sleeve 1110 to slide into first sleeve 1108 along with second intermediate plate 1105 when bellows system 200 is in compression. Second segment 1104 is coupled, e.g., welded, to second intermediate plate 1105 and is disposed within second sleeve 1110. Second segment 1104 and second sleeve 1110 are sized to allow for second segment 1104 to travel within second sleeve 1110 as described with reference to first segment 1100 and first sleeve 1108.

Second segment 1104 is further coupled, e.g., welded, to third intermediate plate 1107. Third intermediate plate 1107 is sized to travel within second sleeve 1104 as described with reference to second intermediate plate 1105 and first sleeve 1108. Second sleeve 1104 includes stop 1102 as described with reference to first sleeve 1108. Stop 1102 prevents third intermediate plate 1107 from exiting second sleeve 1110 when bellows system 200 is in extension.

A third sleeve 1112 and third segment 1106 are coupled, e.g., welded, to third intermediate plate 1107. Third sleeve 1112 and third segment 1106 are sized to slide into second sleeve 1110 further allowing for telescoping of bellows system 200. Additional sleeves, segments, and intermediate plates may be added to provide for bellows system 200 having a desired length in compression and in extension.

Referring now to FIG. 12, bellows system 200, illustrated in compression, includes six telescoping bellow segments 1000 of the type described with reference to FIG. 11 above. Bellows system 200 further includes five sleeves 1002 of the type described with reference to FIG. 11 above and five intermediate plates 1202 of the type described with reference to FIG. 11 above. Each pair of telescoping bellow segment 1000 and corresponding sleeve 1002 are sized to provide for the telescoping function of bellows system 200 described herein. For example, each pair of telescoping bellow segment 1000 and corresponding sleeve 1002 have consecutively reducing diameters to allow for each pair to slide into the above pair.

Bellows system 200 further includes inner sleeve 1200. Inner sleeve 1200 extends within the last telescoping bellow segment 1000 and is coupled, e.g., welded, to guiding plate 302. Inner sleeve 1200 is sized to extend within one or more intermediate plates 1202 when bellows system 200 is in compression. Inner sleeve 1200 may include a stop which has a diameter larger than the last intermediate plate 1202 which prevents inner sleeve 1200 from being pulled out of the last intermediate plate 1202 when bellows system 200 is in expansion. The last telescoping bellow segment 1000 is coupled, e.g., welded, to the last intermediate plate 1202 and guiding plate 302 and is disposed around inner sleeve 1200. The last telescoping bellow segment 1000 has an inner diameter larger than the outer diameter of inner sleeve 1200. Inner sleeve 1200 and the last telescoping bellow segment 1000 are sized to prevent buckling. For example, inner sleeve 1200 is sized to provide a running fit with the last telescoping bellow segment 1000 and to prevent buckling of the last telescoping bellow segment due to interference with inner sleeve 1200.

Each individual telescoping bellow segment 1000 and the corresponding sleeves 1002 and intermediate plates 1202 may have different lengths or the same length, measured along the vertical axis along which bellows system 200 expands and compresses. Telescoping bellow segments 1000 and intermediate plates 1202 are made of one or more metals or metal alloys. For example, telescoping bellow segments 1000 and intermediate plates 1202 may be made of stainless steel or an alloy of stainless steel such as SAE steel grade 321. Sleeves 1002 are made of a different metal or metal alloy. For example, sleeves 1002 may be made of stainless steel or an alloy of stainless steel such as SAE steel grade 316. In alternative embodiments, telescoping bellow segments 1000, intermediate plates 1202, and sleeves 1002 are made of the same metal or metal alloy. In further alternative embodiments, telescoping bellow segments 1000, intermediate plates 1202, and/or sleeves 1002 are made of other materials such as plastics, ceramic coated materials, and/or other materials.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A melt extraction system for extracting a melt from a crucible, the melt extraction system comprising:
    a cylindrical housing having a top plate and a bottom plate opposite the top plate, wherein the top plate and the bottom plate have are toroidal and define an opening;
    an extraction vessel disposed, within the cylindrical housing, configured to remove the melt from the crucible, the extraction vessel coupled to a guide plate disposed within the cylindrical housing and between the top plate and the extraction vessel; and
    a bellows system coupled to the top plate and the guide plate, the bellows system including:
    a first bellows segment having a first end and a second end opposite the first end, the first bellows segment configured to elastically compress and expand;
    a first plate coupled to the second end of the first bellows segment;
    a first sleeve concentric with the first bellows segment and the first plate, the first bellows segment and the first plate disposed within the first sleeve;
    a second bellows segment having a third end and a fourth end opposite the third end, the second bellows segment configured to elastically compress and expand, the third end of the second bellows segment coupled to the first plate; and
    a second sleeve coupled to the first plate, the second sleeve concentric with the second bellows segment and the first sleeve, the second bellows segment disposed within the second sleeve, the second sleeve configured to telescope into the first sleeve.

2. The melt extraction system of claim 1 further comprising a vacuum port coupled to the top plate, the vacuum port configured to provide a vacuum to the opening in the top plate, wherein the bellows system and the first plate are toroidal and define a second opening, the second opening aligned with the opening in the top plate and configured to receive the vacuum.

3. The melt extraction system of claim 2 further comprising a flexible hose coupled to the guiding plate and the extraction vessel, the flexible hose configured to supply the extraction vessel with a vacuum supplied by the bellows system.

4. The melt extraction system of claim 1 further comprising a lifter and a cable having a first end and a second end opposite the first end, the first end of the cable coupled to the lifter and the second end of the cable coupled to the guiding plate, wherein the lifter is configured to raise and lower the guiding plate, wherein the bellows system is configured to elastically compress and expand in response to movement of the guiding plate by the lifter.

5. The melt extraction system of claim 4, further comprising a vacuum port coupled to the top plate, the vacuum port configured to provide a vacuum to the opening in the top plate, the vacuum port having an upper opening and a lower opening opposite the upper opening, wherein the lifter is coupled to the vacuum port at the upper opening, and wherein the cable passes through the upper opening and the lower opening.

6. The melt extraction system of claim 1, wherein the plurality of bellows segments includes a third bellows segment, a fourth bellows segment, a fifth bellows segment, a sixth bellows segment, a third sleeve, a fourth sleeve, a fifth sleeve, a sixth sleeve, a second plate, a third plate, a fourth plate, and a fifth plate.

7. The melt extraction system of claim 6, further comprising a top plate and a guide plate, wherein the first end of the first bellows segment is coupled to the top plate, wherein the first sleeve is coupled to the top plate, wherein the sixth bellows segment is coupled to the guide plate, and wherein the sixth sleeve is coupled to the guide plate, the sixth sleeve disposed within the sixth bellows segment.

8. The melt extraction system of claim 1, wherein the first sleeve includes a stop near one end of the first sleeve the stop configured to prevent the first plate from exiting the first sleeve while allowing the first plate to travel within the first sleeve, and wherein the stop has a reduced inner diameter compared to the first sleeve.

9. The melt extraction system of claim 1, further comprising a second plate disposed within the second sleeve, a third bellows segment coupled to the second plate, and an inner sleeve disposed within the third bellows segment and at least the second plate.

10. The melt extraction system of claim 9, wherein the inner sleeve includes a stop positioned near an end of the inner sleeve opposite a third plate to which the inner sleeve is coupled, the stop having an increased outer diameter compared to the sleeve to prevent the stop from passing through the second plate.

11. A system for extracting a melt, the system comprising:
an extraction system comprising:
a cylindrical housing having a top plate and a bottom plate opposite the top plate, wherein the top plate and the bottom plate have are toroidal and define an opening;
an extraction vessel disposed, within the cylindrical housing, configured to remove the melt from the crucible, the extraction vessel coupled to a guide plate disposed within the cylindrical housing and between the top plate and the extraction vessel; and
a telescoping bellows system coupled to the top plate and the guide plate; and
a melt housing assembly coupled to the bottom plate of the extraction system, the melt housing assembly comprising:
a housing coupled to the bottom plate of the extraction system;
a crucible assembly having at least one crucible configured to contain the melt; and
at least one susceptor configured to provide energy to the melt.

12. The system of claim 11, wherein the telescoping bellows system comprises:
a first bellows segment having a first end and a second end opposite the first end, the first bellows segment configured to elastically compress and expand;
a first plate coupled to the second end of the first bellows segment;
a first sleeve concentric with the first bellows segment and the first plate, the first bellows segment and the first plate disposed within the first sleeve;
a second bellows segment having a third end and a fourth end opposite the third end, the second bellows segment configured to elastically compress and expand, the third end of the second bellows segment coupled to the first plate; and
a second sleeve coupled to the first plate, the second sleeve concentric with the second bellows segment and the first sleeve, the second bellows segment disposed within the second sleeve, the second sleeve configured to telescope into the first sleeve.

13. The system of claim 12, wherein the first sleeve includes a stop near one end of the first sleeve the stop configured to prevent the first plate from exiting the first sleeve while allowing the first plate to travel within the first sleeve, and wherein the stop has a reduced inner diameter compared to the first sleeve.

14. The system of claim 10, wherein the extraction system further comprises:
a vacuum port coupled to the top plate, the vacuum port configured to provide a vacuum to the opening in the top plate and to the telescoping bellows system, the vacuum port having an upper opening, a lower opening opposite the upper opening, and a side opening positioned at an angle between the upper opening and the lower opening; and
a lifter coupled to the vacuum port at the upper opening, wherein a cable coupled to the lifter and coupled to the guide plate passes through the upper opening and the lower opening of the vacuum port, and wherein the cable passes through the telescoping bellows system.

15. The system of claim 14, wherein the extraction system further comprises a flexible hose coupled to the guide plate and the extraction vessel, the flexible hose configured to receive the vacuum from the segmented bellows system and provide the vacuum to the extraction vessel, the extraction vessel configured to use the vacuum to extract the melt from the crucible assembly into the extraction vessel.

* * * * *